United States Patent
Iwatsu

(10) Patent No.: US 10,468,488 B2
(45) Date of Patent: Nov. 5, 2019

(54) SEMICONDUCTOR DEVICE

(71) Applicants: Kabushiki Kaisha Toshiba, Minato-ku, Tokyo (JP); Toshiba Electronic Devices & Storage Corporation, Minato-ku, Tokyo (JP)

(72) Inventor: Yasunori Iwatsu, Chigasaki Kanagawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 15/921,067

(22) Filed: Mar. 14, 2018

(65) Prior Publication Data
US 2019/0081146 A1    Mar. 14, 2019

(30) Foreign Application Priority Data
Sep. 14, 2017  (JP) ................ 2017-177095

(51) Int. Cl.
*H01L 29/66*    (2006.01)
*H01L 29/417*    (2006.01)
(Continued)

(52) U.S. Cl.
CPC .... *H01L 29/41783* (2013.01); *H01L 29/0865* (2013.01); *H01L 29/0882* (2013.01);
(Continued)

(58) Field of Classification Search
CPC ............ H01L 27/0262; H01L 27/0277; H01L 29/1004; H01L 29/1095; H01L 29/66674;
(Continued)

(56) References Cited

U.S. PATENT DOCUMENTS 5,444,002 A  *  8/1995  Yang ................ H01L 29/66674
                                              257/E21.417
6,025,237 A       2/2000  Choi
(Continued)

FOREIGN PATENT DOCUMENTS

JP        06-038449 B2     5/1994
JP        10-270709 A     10/1998
JP        2015-216218 A   12/2015

*Primary Examiner* — Eduardo A Rodela
(74) *Attorney, Agent, or Firm* — White & Case LLP

(57) ABSTRACT

According to one embodiment, a semiconductor device includes a first semiconductor region, a second semiconductor region of a first conductivity type, a third semiconductor region of a second conductivity type, a fourth semiconductor region of the second conductivity type, a gate electrode, a first electrode, and a second electrode. The fourth semiconductor region includes a first portion and a second portion. The first portion is arranged with the second semiconductor region in a second direction crossing a first direction from the first semiconductor region to the second semiconductor region. The second portion is located above the third semiconductor region. The gate electrode is provided via a gate insulating layer on another part of the second semiconductor region, part of the third semiconductor region, and the first portion. The first electrode is provided on another part of the third semiconductor region. The second electrode is provided on the second portion.

12 Claims, 6 Drawing Sheets

(51) Int. Cl.
  *H01L 29/78* (2006.01)
  *H01L 29/08* (2006.01)
  *H01L 29/40* (2006.01)
  *H01L 29/423* (2006.01)
  *H01L 29/10* (2006.01)

(52) U.S. Cl.
  CPC ........ *H01L 29/1095* (2013.01); *H01L 29/401* (2013.01); *H01L 29/42368* (2013.01); *H01L 29/42376* (2013.01); *H01L 29/66681* (2013.01); *H01L 29/7816* (2013.01)

(58) Field of Classification Search
  CPC ......... H01L 29/66681; H01L 29/66689; H01L 29/66696; H01L 29/666704; H01L 29/66712; H01L 29/66719; H01L 29/66727; H01L 29/66734; H01L 29/7801
  See application file for complete search history.

(56) References Cited

U.S. PATENT DOCUMENTS

| | | | |
|---|---|---|---|
| 6,093,588 A * | 7/2000 | De Petro | H01L 29/0696 438/180 |
| 6,858,500 B2 * | 2/2005 | Sugi | H01L 21/8234 257/E21.616 |
| 7,109,551 B2 * | 9/2006 | Sugi | H01L 21/76283 257/162 |
| 7,408,224 B2 * | 8/2008 | Kim | H01L 27/10876 257/330 |
| 7,417,298 B2 * | 8/2008 | Depetro | H01L 21/26586 257/510 |
| 7,800,167 B2 * | 9/2010 | Kitamura | H01L 27/0629 257/329 |
| 2004/0256666 A1 * | 12/2004 | Fujishima | H01L 21/82348 257/329 |
| 2005/0142713 A1 * | 6/2005 | Fujishima | H01L 21/82348 438/197 |
| 2005/0179081 A1 * | 8/2005 | Kitamura | H01L 29/66666 257/329 |
| 2006/0166419 A1 * | 7/2006 | Shimoyama | H01L 29/66621 438/173 |
| 2009/0224314 A1 * | 9/2009 | Kitamura | H01L 29/063 257/330 |
| 2015/0325693 A1 | 11/2015 | Mori | |
| 2016/0099340 A1 * | 4/2016 | Hsu | H01L 29/66689 257/339 |

* cited by examiner

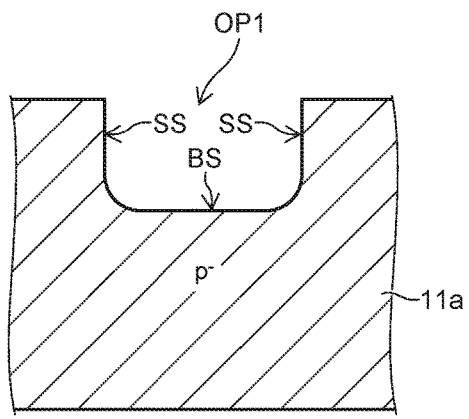
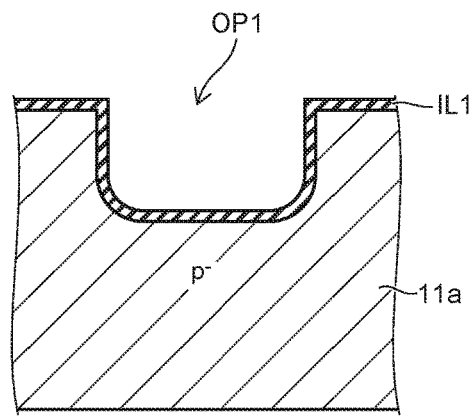
FIG. 3A          FIG. 3B
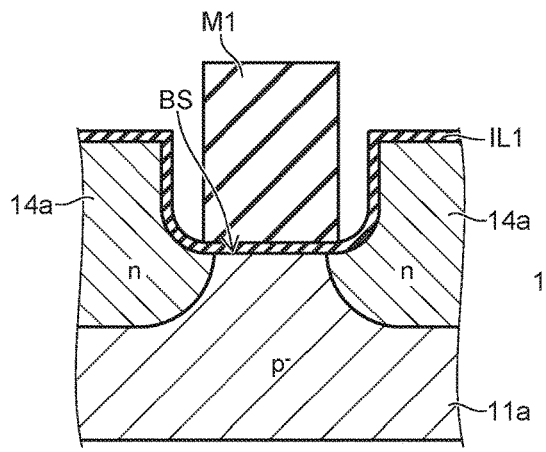
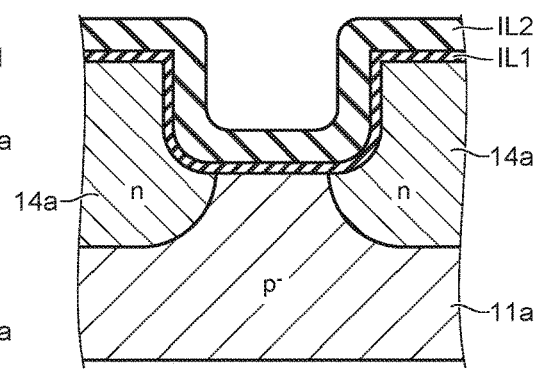
FIG. 3C          FIG. 3D
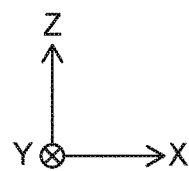

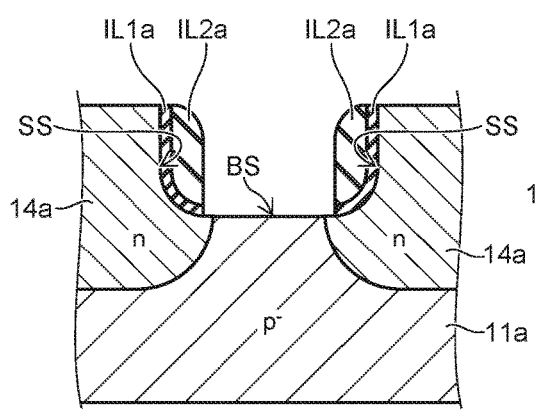
FIG. 4A
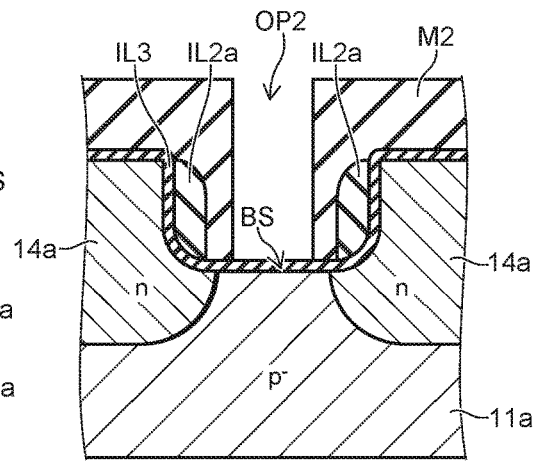
FIG. 4B
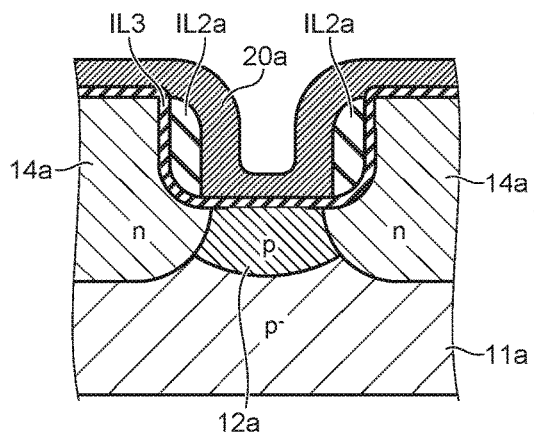
FIG. 4C
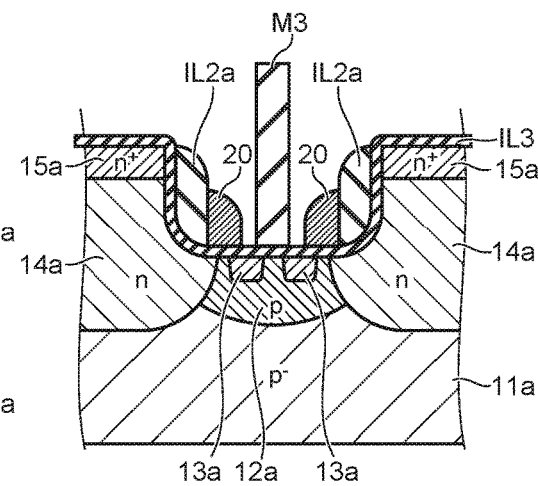
FIG. 4D
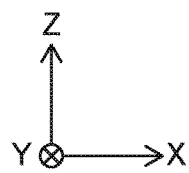

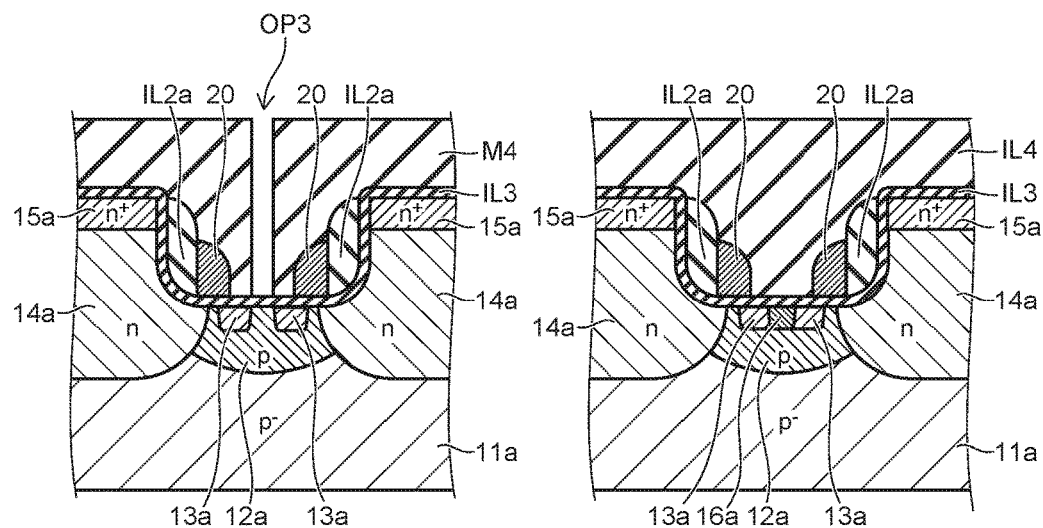
FIG. 5A  FIG. 5B
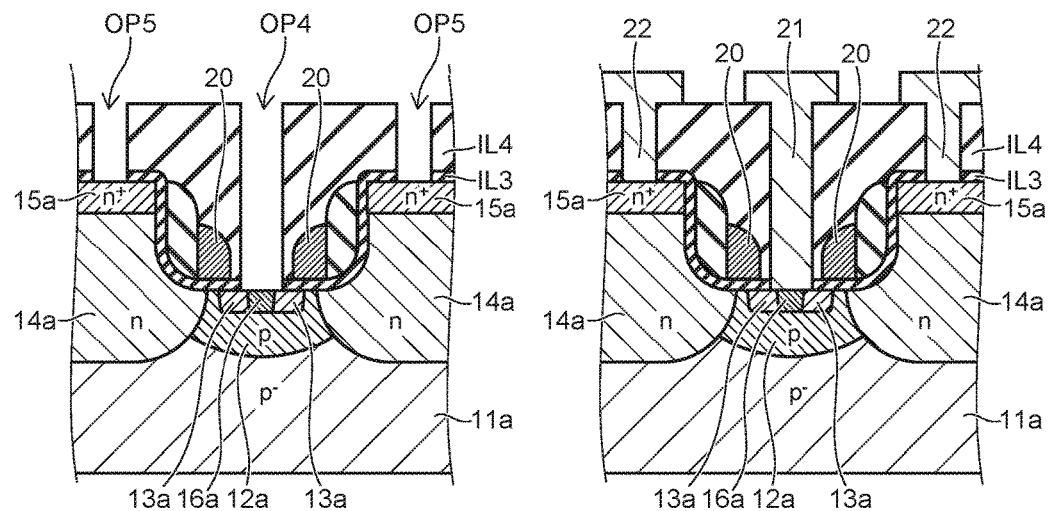
FIG. 5C  FIG. 5D
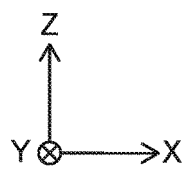

SEMICONDUCTOR DEVICE

CROSS-REFERENCE TO RELATED APPLICATIONS

This application is based upon and claims the benefit of priority from Japanese Patent Application No. 2017-177095, filed on Sep. 14, 2017; the entire contents of which are incorporated herein by reference.

FIELD

Embodiments described herein relate generally to a semiconductor device.

BACKGROUND

In a semiconductor device such as MOSFET (metal oxide semiconductor field effect transistor), reduction of resistance in the on-state (on-resistance) is desired.

BRIEF DESCRIPTION OF THE DRAWINGS

FIGS. 3A to 5D are process sectional views showing a process for manufacturing the semiconductor device according to the embodiment.

DETAILED DESCRIPTION

Figure 1:
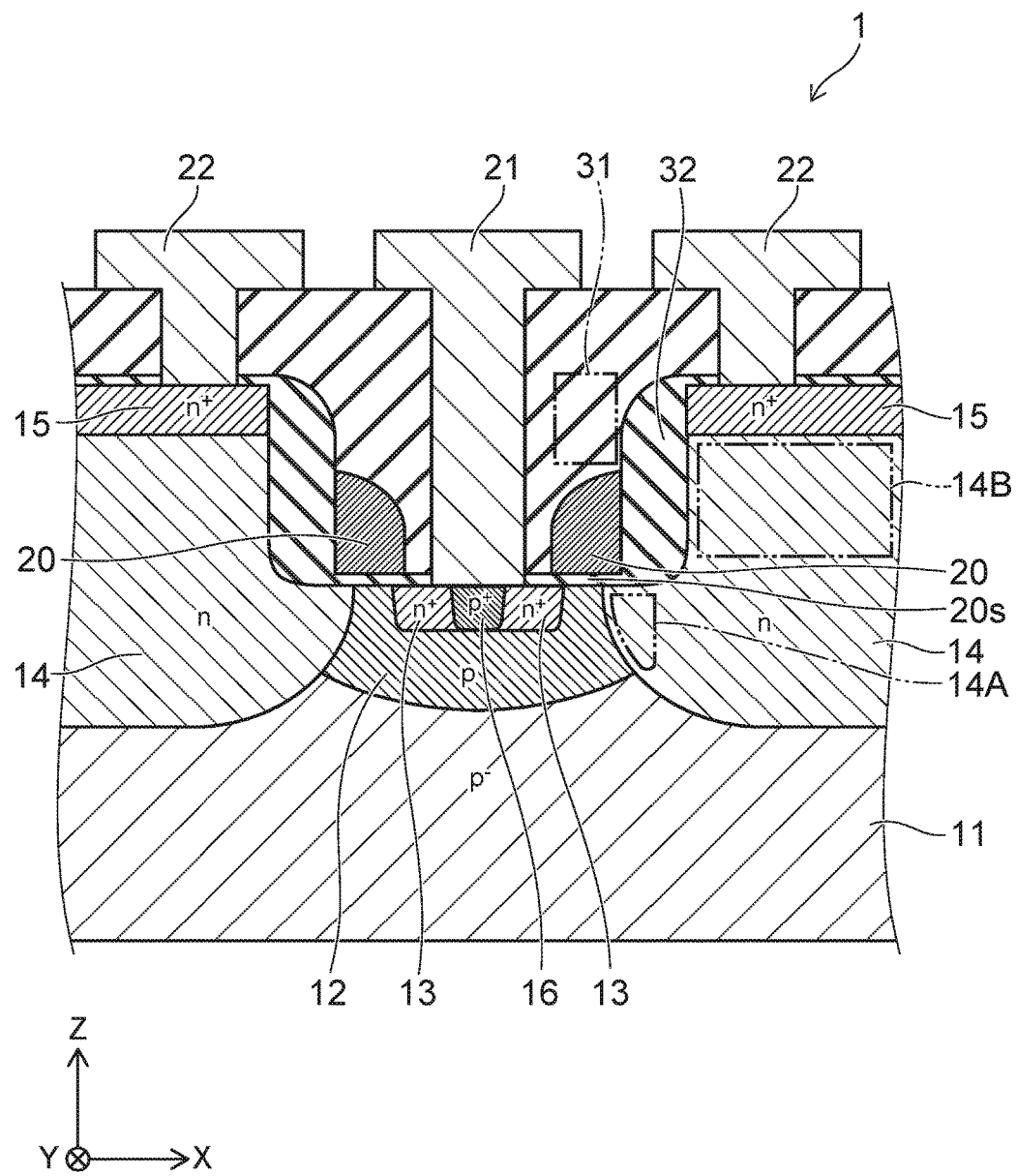
FIG. 1 is a sectional view showing a semiconductor device 1 according to an embodiment.

According to one embodiment, a semiconductor device includes a first semiconductor region, a second semiconductor region of a first conductivity type, a third semiconductor region of a second conductivity type, a fourth semiconductor region of the second conductivity type, a gate electrode, a first electrode, and a second electrode. The second semiconductor region is provided on part of the first semiconductor region. The third semiconductor region is provided on part of the second semiconductor region. The fourth semiconductor region is provided on another part of the first semiconductor region. The fourth semiconductor region includes a first portion and a second portion. The first portion is arranged with the second semiconductor region in a second direction crossing a first direction from the first semiconductor region to the second semiconductor region. The second portion is located above the third semiconductor region. The gate electrode is provided via a gate insulating layer on another part of the second semiconductor region, part of the third semiconductor region, and the first portion. The first electrode is provided on another part of the third semiconductor region and electrically connected to the third semiconductor region. The second electrode is provided on the second portion and electrically connected to the fourth semiconductor region.

Embodiments of the invention will now be described with reference to the drawings.

The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

In the drawings and the specification of the application, components similar to those described thereinabove are marked with like reference numerals, and a detailed description is omitted as appropriate.

In the following description, the notations of $n^+$, n, $n^-$, $p^+$, p, and $p^-$ indicate relative levels of the impurity concentrations of the conductivity types. In other words, a notation marked with "+" indicates an impurity concentration relatively higher than a notation not marked with either "+" or "−;" and a notation marked with "−" indicates an impurity concentration relatively lower than a notation not marked with either "+" or "−."

The embodiments described below may be implemented by reversing the p-type and the n-type of the semiconductor regions.

FIG. 1 is a sectional view showing a semiconductor device 1 according to an embodiment.

The semiconductor device 1 is e.g. an LDMOS (laterally diffused metal oxide semiconductor). As shown in FIG. 1, the semiconductor device 1 according to the embodiment includes a semiconductor region 11 (first semiconductor region), a p-type (an example of first conductivity type) base region 12 (second semiconductor region), an $n^+$-type (an example of second conductivity type) source region 13 (third semiconductor region), an n-type drift region 14 (fourth semiconductor region), a gate electrode 20, a source electrode 21 (first electrode), and a drain electrode 22 (second electrode).

In the following, an XYZ coordinate system is used for the description of the embodiment. The direction from the semiconductor region 11 to the p-type base region 12 is referred to as Z-direction (first direction). A direction crossing the first direction is referred to as X-direction (second direction). A direction crossing the plane including the X-direction and the Z-direction is referred to as Y-direction.

In the example shown in FIG. 1, the semiconductor device 1 further includes an $n^+$-type drain region 15 (fifth semiconductor region), a $p^+$-type back gate region 16 (sixth semiconductor region), a first insulating part 31, and a second insulating part 32. In this example, the $n^+$-type source region 13, the n-type drift region 14, the $n^+$-type drain region 15, the gate electrode 20, and the drain electrode 22 are provided in a plurality in the X-direction.

The conductivity type of the semiconductor region 11 is e.g. $p^-$-type. The conductivity type of the semiconductor region 11 may be $n^-$-type. The p-type base region 12 is provided on part of the semiconductor region 11. The $n^+$-type source region 13 and the $p^+$-type back gate region 16 are provided on part of the p-type base region 12. The $p^+$-type back gate region 16 is located between the $n^+$-type source regions 13 in the X-direction.

The n-type drift region 14 is provided on another part of the semiconductor region 11. The n-type drift region 14 includes a first portion 14A and a second portion 14B. The first portion 14A is arranged with the p-type base region 12 in the X-direction. The second portion 14B is located above the $n^+$-type source region 13 and the $p^+$-type back gate region 16.

The gate electrode 20 is provided via a gate insulating layer 20s on another part of the p-type base region 12, part of the $n^+$-type source region 13, and the first portion 14A. At least part of the P-N junction interface between the p-type base region 12 and the n-type drift region 14 is located below the gate electrode 20.

The source electrode 21 is provided on a plurality of n$^+$-type source regions 13 and the p$^+$-type back gate region 16 and electrically connected to these semiconductor regions.

The n$^+$-type drain region 15 is provided on the second portion 14B. The drain electrode 22 is provided on the n$^+$-type drain region 15 and electrically connected to the n-type drift region 14 and the n$^+$-type drain region 15.

The first insulating part 31 is provided on the gate electrode 20. The first insulating part 31 is arranged with the n$^+$-type drain region 15 in the X-direction. The second insulating part 32 is provided between the gate electrode 20 and the second portion 14B in the X-direction.

Figure 2:
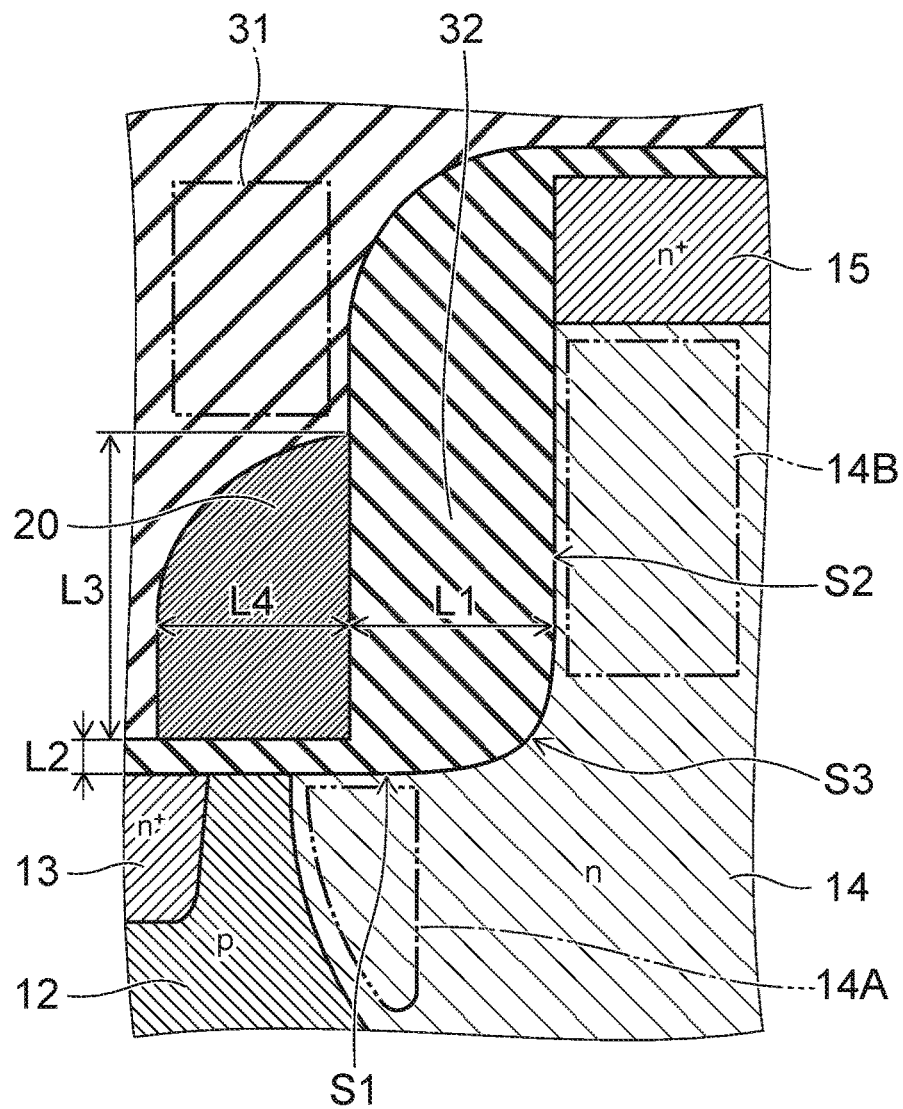
FIG. 2 is an enlarged sectional view showing part of the semiconductor device 1 according to the embodiment.

FIG. 2 is an enlarged sectional view showing part of the semiconductor device 1 according to the embodiment.

The neighborhood of the gate electrode 20 and the second insulating part 32 shown in FIG. 1 is enlarged in FIG. 2.

As shown in FIG. 2, the X-direction length L1 of the second insulating part 32 is longer than the Z-direction length L2 of the gate insulating layer 20s. The Z-direction length L3 of the gate electrode 20 is longer than the X-direction length L4 of the gate electrode 20.

The lower end of the second insulating part 32 is curved. More specifically, the second insulating part 32 has a first surface S1, a second surface S2, and a curved surface S3. The first surface S1 is in contact with the first portion 14A and lies along the X-direction and the Y-direction. The second surface S2 is in contact with the second portion 14B and lies along the Z-direction and the Y-direction. The curved surface S3 is provided between the first surface S1 and the second surface S2. The curved surface S3 is retracted to the X-direction relative to the first surface S1, and retracted to the Z-direction relative to the second surface S2.

The operation of the semiconductor device 1 is described.

The drain electrode 22 is applied with a positive voltage relative to the source electrode 21. In this state, the gate electrode 20 is applied with a voltage higher than or equal to a threshold. Then, a channel (inversion layer) is formed in the p-type base region 12 near the gate insulating layer 20s, and the semiconductor device 1 is turned on. Electrons flow through this channel from the source electrode 21 to the drain electrode 22. Subsequently, the voltage applied to the gate electrode 20 falls below the threshold. Then, the channel in the p-type base region 12 vanishes, and the semiconductor device 1 is turned off.

When the semiconductor device 1 is in the off-state, the upper part of the gate electrode 20 functions as a field plate electrode. The second insulating part 32 functions as a field insulating layer. This suppresses electric field concentration in the upper end of the gate electrode 20 and the lower end of the second insulating part 32.

An example of the material of each component is described.

The semiconductor region 11, the p-type base region 12, the n$^+$-type source region 13, the n-type drift region 14, the n$^+$-type drain region 15, and the p$^+$-type back gate region 16 contain e.g. silicon, silicon carbide, gallium nitride, or gallium arsenide as a semiconductor material. When the semiconductor material is silicon, the n-type impurity can be arsenic, phosphorus, or antimony. The p-type impurity can be boron.

The gate electrode 20 contains a conductive material such as polysilicon. The gate insulating layer 20s, the first insulating part 31, and the second insulating part 32 contain an insulating material such as silicon oxide or silicon nitride. The source electrode 21 and the drain electrode 22 contain a metal material such as aluminum, tungsten, or nickel.

An example of a method for manufacturing the semiconductor device 1 according to the embodiment is described with reference to FIGS. 3A to 5D.

FIGS. 3A to 5D are process sectional views showing a process for manufacturing the semiconductor device 1 according to the embodiment.

First, a p$^-$-type semiconductor layer 11a is prepared. The semiconductor layer 11a may be of n$^-$-type. The semiconductor layer 11a is e.g. part of a semiconductor substrate. Alternatively, the semiconductor layer 11a may be formed by epitaxial growth of a semiconductor material on a semiconductor substrate.

As shown in FIG. 3A, an opening OP1 is formed in the upper surface of this semiconductor layer 11a. At this time, a curved surface, for instance, is formed between the side surface SS and the bottom surface BS of the opening OP1. The semiconductor layer 11a is thermally oxidized to form an insulating layer IL1 on the upper surface of the semiconductor layer 11a as shown in FIG. 3B.

A mask M1 is formed on the bottom surface BS on which the insulating layer IL1 has been formed. In the state in which the mask M1 is formed, the semiconductor layer 11a is ion-implanted with n-type impurity to form an n-type semiconductor region 14a as shown in FIG. 3C. This ion implantation is performed by e.g. rotating the semiconductor layer 11a while injecting n-type impurity ions into the semiconductor layer 11a from a direction inclined with respect to the rotation axis.

After the mask M1 is removed, as shown in FIG. 3D, an insulating layer IL2 thicker than the insulating layer IL1 is formed on the insulating layer IL1. The insulating layer IL2 is formed by e.g. depositing silicon oxide using the CVD (chemical vapor deposition) method.

Part of the insulating layer IL1 and part of the insulating layer IL2 are removed. Thus, an insulating layer IL1a and an insulating layer IL2a covering the side surface SS and the X-direction end part of the bottom surface BS are formed as shown in FIG. 4A.

The semiconductor layer 11a is thermally oxidized to form an insulating layer on the upper surface of the exposed semiconductor layer 11a. This insulating layer and the previously formed insulating layer IL1a form an insulating layer IL3 covering the upper surface of the semiconductor layer 11a. A mask M2 covering the insulating layer IL2a and part of the insulating layer IL3 is formed as shown in FIG. 4B. The mask M2 has an opening OP2. In the Z-direction, the opening OP2 overlaps part of the semiconductor layer 11a between the n-type semiconductor regions 14a.

The semiconductor layer 11a is ion-implanted with p-type impurity through the opening OP2 to form a p-type semiconductor region 12a. After the mask M2 is removed, a conductive layer 20a covering the insulating layer IL2a and the insulating layer IL3 is formed as shown in FIG. 4C.

Part of the conductive layer 20a adjacent to the side surface of the insulating layer IL2a is left inside the opening OP1, and the other portion of the conductive layer 20a is removed. Thus, a gate electrode 20 is formed inside the opening OP1. After the gate electrode 20 is formed, a mask M3 is formed. The mask M3 is located between the gate electrodes 20 and spaced from the gate electrodes 20. In the state in which the mask M3 is formed, n-type impurity is ion-implanted. By this ion implantation, as shown in FIG. 4D, a plurality of n$^+$-type semiconductor regions 13a are formed on part of the p-type semiconductor region 12a, and an n$^+$-type semiconductor region 15a is formed on the n-type semiconductor region 14a.

After the mask M3 is removed, a mask M4 covering the insulating layer IL2a, part of the insulating layer IL3, and the gate electrode 20 is formed as shown in FIG. 5A. The opening OP3 of this mask M4 overlaps part of the n$^+$-type semiconductor region 13a in the Z-direction.

P-type impurity is ion-implanted through the opening OP3 of the mask M4 to form a p$^+$-type semiconductor region 16a between the n$^+$-type semiconductor regions 13a. After the mask M4 is removed, an insulating layer IL4 covering the insulating layer IL2a, the insulating layer IL3, and the gate electrode 20 is formed as shown in FIG. 5B.

The p-type semiconductor region 12a, the n$^+$-type semiconductor region 13a, the n-type semiconductor region 14a, the n$^+$-type semiconductor region 15a, and the p$^+$-type semiconductor region 16a shown in FIG. 5B correspond to the p-type base region 12, the n$^+$-type source region 13, the n-type drift region 14, the n$^+$-type drain region 15, and the p$^+$-type back gate region 16 shown in FIG. 1, respectively. The semiconductor layer 11a except these semiconductor regions corresponds to the semiconductor region 11.

An opening OP4 and an opening OP5 penetrating the insulating layer IL3 and the insulating layer IL4 are formed. Part of the n$^+$-type semiconductor region 13a and the p$^+$-type semiconductor region 16a are exposed through the opening OP4. Part of the n$^+$-type semiconductor region 15a is exposed through the opening OP5.

A metal layer covering the insulating layer IL4 and burying the opening OP4 and the opening OP5 is formed. This metal layer is patterned to form a source electrode 21 and a drain electrode 22 as shown in FIG. 5D. The semiconductor device 1 shown in FIG. 1 is manufactured by the above process.

The effect of this embodiment is described with reference to FIG. 6.

Figure 6:
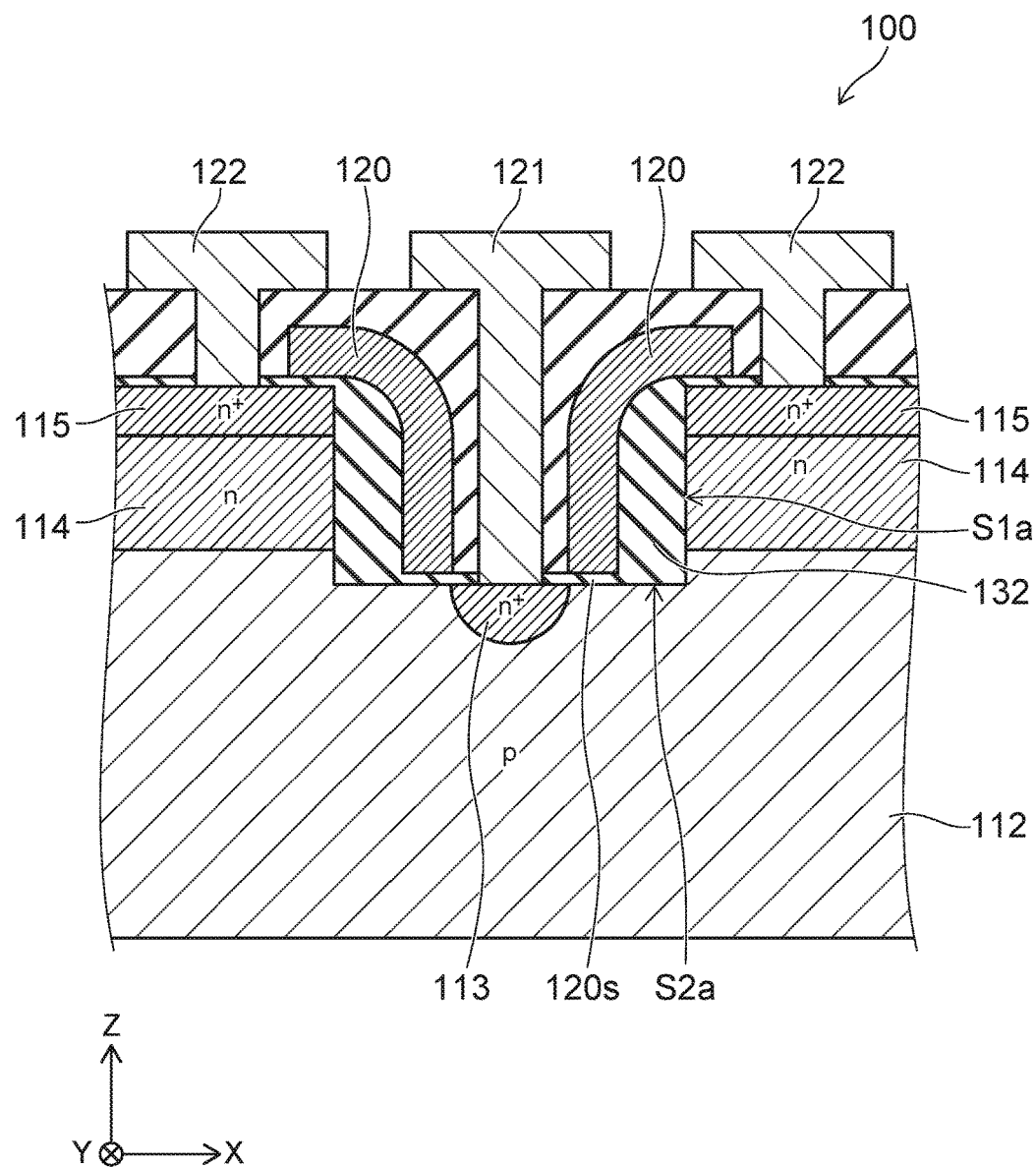
FIG. 6 is a sectional view showing a semiconductor device according to a reference example.

FIG. 6 is a sectional view showing a semiconductor device 100 according to a reference example.

The semiconductor device 100 according to the reference example includes a p-type base region 112, an n$^+$-type source region 113, an n-type drift region 114, an n$^+$-type drain region 115, a gate electrode 120, a gate insulating layer 120s, a source electrode 121, a drain electrode 122, and an insulating part 132.

In the semiconductor device 100, the n-type drift region 114 is arranged with the gate electrode 120 in the X-direction. The P-N junction interface between the p-type base region 112 and the n-type drift region 114 is arranged with the gate electrode 120 in the X-direction. Part of the gate electrode 120 is arranged with the n$^+$-type drain region 115 and the drain electrode 122 in the X-direction. The insulating part 132 is provided between the gate electrode 120 and the n-type drift region 114 and between the gate electrode 120 and part of the p-type base region 112 in the X-direction. The lower end of this insulating part 132 lies along the X-direction.

In the semiconductor device 100 according to the reference example, when the gate electrode 120 is applied with a voltage, a channel is formed near the gate insulating layer 120s and the insulating part 132. However, the insulating part 132 is thicker than the gate insulating layer 120s. Thus, the channel is not formed in the portion of the p-type base region 112 in contact with the lower part of the insulating part 132. Accordingly, the channel is not connected to the n-type drift region 114. This results in a large on-resistance.

In the semiconductor device 1 according to this embodiment, the gate electrode 20 is provided via the gate insulating layer 20s on the first portion 14A of the n-type drift region 14. The channel formed in the surface of the p-type base region 12 is connected to the n-type drift region 14. Thus, the on-resistance can be made lower than in the semiconductor device 100.

Furthermore, the semiconductor device 1 according to this embodiment is different from the semiconductor device 100 in that the second insulating part 32 provided on the gate electrode 20 is arranged with the n$^+$-type drain region 15 in the X-direction. In other words, in the semiconductor device 1, the gate electrode 20 is not arranged with the n$^+$-type drain region 15 in the X-direction. The gate electrode 20 is spaced from the n$^+$-type drain region 15 in the X-direction and the Z-direction. This configuration reduces the electric field strength between the gate electrode 20 and the n$^+$-type drain region 15. Thus, the breakdown voltage of the semiconductor device 1 can be improved. Alternatively, by the amount of improvement in the breakdown voltage of the semiconductor device 1, the X-direction length (device length) of the semiconductor device 1 can be made shorter. Alternatively, by the amount of improvement in the breakdown voltage of the semiconductor device 1, the impurity concentration in the n-type drift region 14 can be increased to reduce the on-resistance. Because the gate electrode 20 is spaced from the drain electrode 22, the capacitance between the gate electrode 20 and the drain electrode 22 can be reduced. By reducing this capacitance, for instance, the switching time of the semiconductor device 1 is made shorter. Thus, the switching loss can be reduced.

Moreover, as shown in FIG. 2, the length L1 of the second insulating part 32 is longer than the length L2 of the gate insulating layer 20s. The length L3 of the gate electrode 20 is longer than the length L4. This configuration effectively relaxes electric field concentration in e.g. the upper end of the gate electrode 20 and the lower end of the second insulating part 32 when the semiconductor device 1 is in the off-state. Thus, the breakdown voltage of the semiconductor device 1 can be further improved.

Another electrode functioning as a field plate electrode may be provided on the gate electrode 20 with spacing from the gate electrode 20. However, because part of the gate electrode 20 functions as a field plate electrode, for instance, the number of interconnects in the semiconductor device 1 is reduced. This can further simplify the structure of the semiconductor device 1.

In the semiconductor device 100 according to the reference example, the curvature of the insulating part 132 is large between the surface S1a along the X-direction and the surface S2a along the Z-direction. In contrast, in the semiconductor device 1 according to this embodiment, the lower end of the second insulating part 32 is curved. Thus, the curvature of the second insulating part 32 is small between the first surface S1 and the second surface S2. This configuration effectively relaxes electric field concentration in the lower end of the second insulating part 32. Thus, the breakdown voltage of the semiconductor device 1 can be further improved.

It is possible to confirm the relative levels of the impurity concentrations of the semiconductor regions in the embodiments described above, for example, using a SCM (scanning capacitance microscope). The carrier concentrations of the semiconductor regions may be considered to be equal to the activated impurity concentrations of the semiconductor regions. Accordingly, the relative levels of the carrier concentrations of the semiconductor regions can be confirmed using SCM. It is possible to measure the impurity concentrations of the semiconductor regions, for example, using a SIMS (secondary ion mass spectrometer).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention. Moreover, above-mentioned embodiments can be combined mutually and can be carried out.

What is claimed is:

1. A semiconductor device comprising:
a first semiconductor region;
a second semiconductor region of a first conductivity type provided on part of the first semiconductor region;
a third semiconductor region of a second conductivity type provided on part of the second semiconductor region;
a fourth semiconductor region of the second conductivity type provided on another part of the first semiconductor region and including:
   a first portion arranged with the second semiconductor region in a second direction crossing a first direction from the first semiconductor region to the second semiconductor region; and
   a second portion located above the third semiconductor region;
a gate electrode provided via a gate insulating layer on another part of the second semiconductor region, part of the third semiconductor region, and the first portion;
a first electrode provided on another part of the third semiconductor region and electrically connected to the third semiconductor region;
a second electrode provided on the second portion and electrically connected to the fourth semiconductor region; and
a second insulating part provided between the gate electrode and the second portion in the second direction,
wherein length in the second direction of the second insulating part is longer than length in the first direction of the gate insulating layer.

2. The device according to claim 1, further comprising:
a fifth semiconductor region of the first conductivity type provided on the second portion; and
a first insulating part provided on the gate electrode,
wherein carrier concentration of the first conductivity type in the fifth semiconductor region is higher than carrier concentration of the first conductivity type in the second portion, and
the fifth semiconductor region is arranged with the first insulating part in the second direction.

3. The device according to claim 2, wherein the first insulating part is located between the first electrode and the fifth semiconductor region in the second direction.

4. The device according to claim 1, wherein a lower end of the second insulating part is curved.

5. The device according to claim 1, wherein length in the first direction of the gate electrode is longer than length in the second direction of the gate electrode.

6. The device according to claim 1, wherein the gate electrode is located between the first electrode and the second portion in the second direction.

7. The device according to claim 1, further comprising:
a sixth semiconductor region of the first conductivity type provided on the other part of the third semiconductor region,
wherein the first electrode is electrically connected to the fifth semiconductor region and the sixth semiconductor region.

8. The device according to claim 7, wherein a carrier concentration of the first conductivity type in the sixth semiconductor region is higher than a carrier concentration of the first conductivity type in the second semiconductor region.

9. The device according to claim 1, wherein at least part of a P-N junction interface between the second semiconductor region and the fourth semiconductor region is located below the gate electrode.

10. The device according to claim 1, wherein conductivity type of the first semiconductor region is the first conductivity type.

11. The device according to claim 1, wherein conductivity type of the first semiconductor region is the second conductivity type.

12. The device according to claim 1, wherein
the first conductivity type is p-type, and
the second conductivity type is n-type.

* * * * *